(12) United States Patent
Takano

(10) Patent No.: US 12,095,426 B2
(45) Date of Patent: Sep. 17, 2024

(54) AMPLIFIER AND SIGNAL PROCESSING APPARATUS

(71) Applicant: SONY SEMICONDUCTOR SOLUTIONS CORPORATION, Kanagawa (JP)

(72) Inventor: Hideyuki Takano, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 330 days.

(21) Appl. No.: 17/637,067

(22) PCT Filed: Jul. 31, 2020

(86) PCT No.: PCT/JP2020/029404
§ 371 (c)(1),
(2) Date: Feb. 22, 2022

(87) PCT Pub. No.: WO2021/039279
PCT Pub. Date: Mar. 4, 2021

(65) Prior Publication Data
US 2022/0302882 A1    Sep. 22, 2022

(30) Foreign Application Priority Data

Aug. 30, 2019    (JP) .................................. 2019-158605

(51) Int. Cl.
*H03F 1/56*    (2006.01)
*H03F 1/34*    (2006.01)
(Continued)

(52) U.S. Cl.
CPC ............... *H03F 1/34* (2013.01); *H03F 1/565* (2013.01); *H03F 3/45251* (2013.01); *H03H 7/25* (2013.01); *H03F 2200/294* (2013.01)

(58) Field of Classification Search
CPC .. H03F 1/34; H03F 3/45251; H03F 2200/294; H03F 1/347; H03F 2200/18;
(Continued)

(56) References Cited

U.S. PATENT DOCUMENTS 10,291,194 B2 *    5/2019    Ilkov .................... H03G 3/3036
2015/0280673 A1    10/2015    Tasic et al.
2019/0158032 A1    5/2019    Takano et al.

FOREIGN PATENT DOCUMENTS

CN    106134087 A    11/2016
JP    2017-515356 A    6/2017
(Continued)

OTHER PUBLICATIONS

International Search Report and Written Opinion of PCT Application No. PCT/JP2020/029404, issued on Oct. 13, 2020, 08 pages of ISRWO.

(Continued)

*Primary Examiner* — Andrea Lindgren Baltzell
*Assistant Examiner* — Khiem D Nguyen
(74) *Attorney, Agent, or Firm* — CHIP LAW GROUP

(57) ABSTRACT

An amplifier includes a P-type transistor and an N-type transistor that are connected in series, an operation amplifier, a transformer, and a variable attenuator. In the operation amplifier, an output terminal is coupled to a gate side of one of the P-type transistor and the N-type transistor, one of an inverting input terminal and a non-inverting input terminal is coupled to drain sides of both of the P-type transistor and the N-type transistor, and a reference voltage is to be applied to the other of the inverting input terminal and the non-inverting input terminal. In the transformer, a primary coil is coupled to a source side of one of the P-type transistor and the N-type transistor. The variable attenuator is provided (Continued)

between a secondary coil and gate terminals of both of the N-type transistor and the P-type transistor.

10 Claims, 4 Drawing Sheets

(51) Int. Cl.
*H03F 3/45* (2006.01)
*H03H 7/25* (2006.01)

(58) Field of Classification Search
CPC ......... H03F 2200/216; H03F 2200/492; H03F 2200/498; H03F 2200/534; H03F 2200/91; H03F 3/195; H03F 2200/451; H03F 2200/513; H03F 2200/72; H03H 7/25; H03G 3/3036; H03G 2201/106; H04B 1/18

USPC ... 330/276, 65, 79, 154, 165, 171, 188, 195, 330/197, 51, 311
See application file for complete search history.

(56) References Cited

FOREIGN PATENT DOCUMENTS

| KR | 10-2016-0138072 A | 12/2016 |
| WO | 2015/153311 A1 | 10/2015 |
| WO | 2016/152267 A1 | 9/2016 |

OTHER PUBLICATIONS

Li, et al., "Gm-Boosted Common-Gate LNA and Differential Colpitts VCO/QVCO in 0.18um CMOS", IEEE Journal of Solid-State Circuits, vol. 40, Issue 12, Dec. 5, 2005.

\* cited by examiner

[ FIG. 1 ]
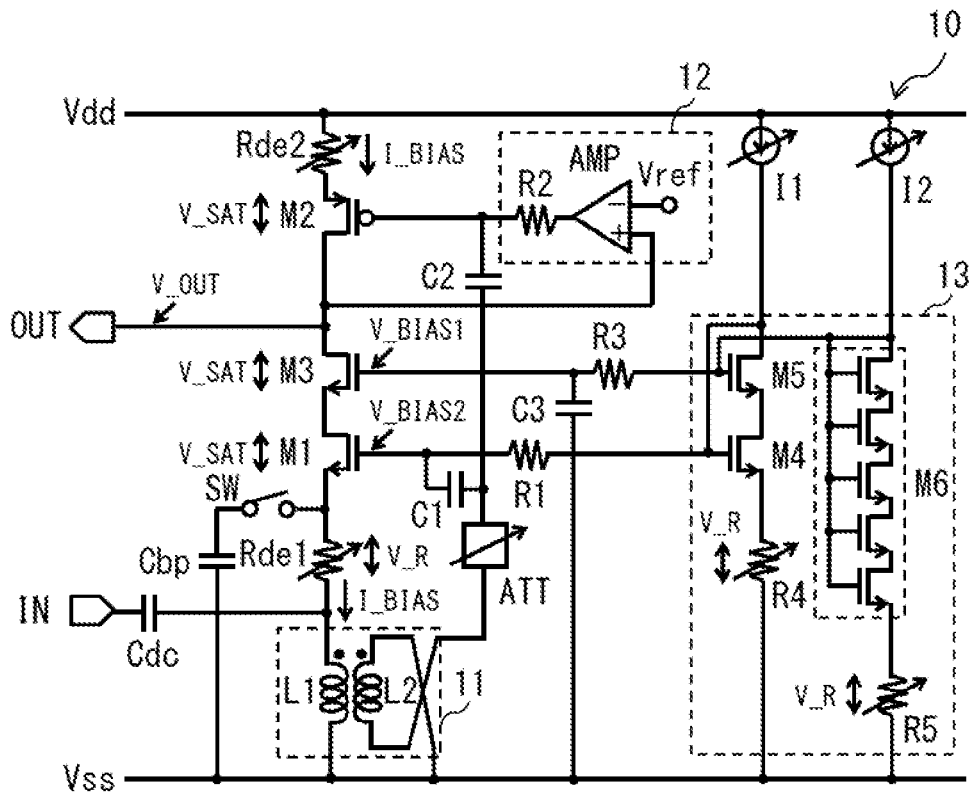
[ FIG. 2 ]
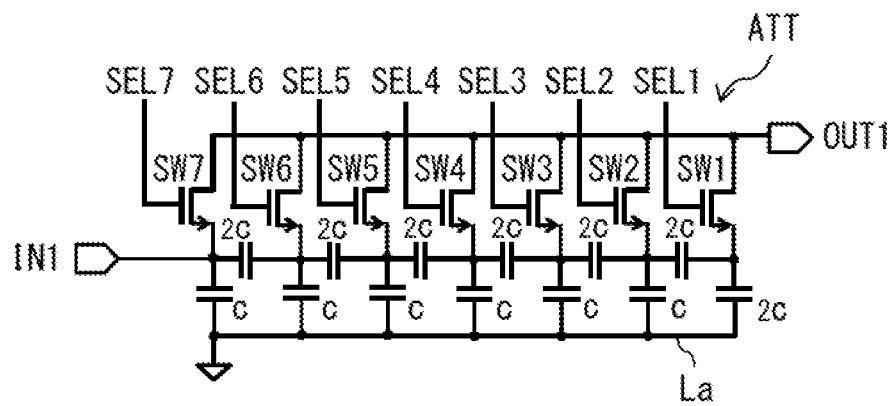

[ FIG. 3 ]
| ATTSEL | Attn. | SEL7 | SEL6 | SEL5 | SEL4 | SEL3 | SEL2 | SEL1 |
|---|---|---|---|---|---|---|---|---|
| 0 | 0 | H | L | L | L | L | L | L |
| 1 | -5 | L | H | L | L | L | L | L |
| 2 | -12 | L | L | H | L | L | L | L |
| 3 | -18 | L | L | L | H | L | L | L |
| 4 | -24 | L | L | L | L | H | L | L |
| 5 | -30 | L | L | L | L | L | H | L |
| 6 | -36 | L | L | L | L | L | L | H |
[ FIG. 4 ]
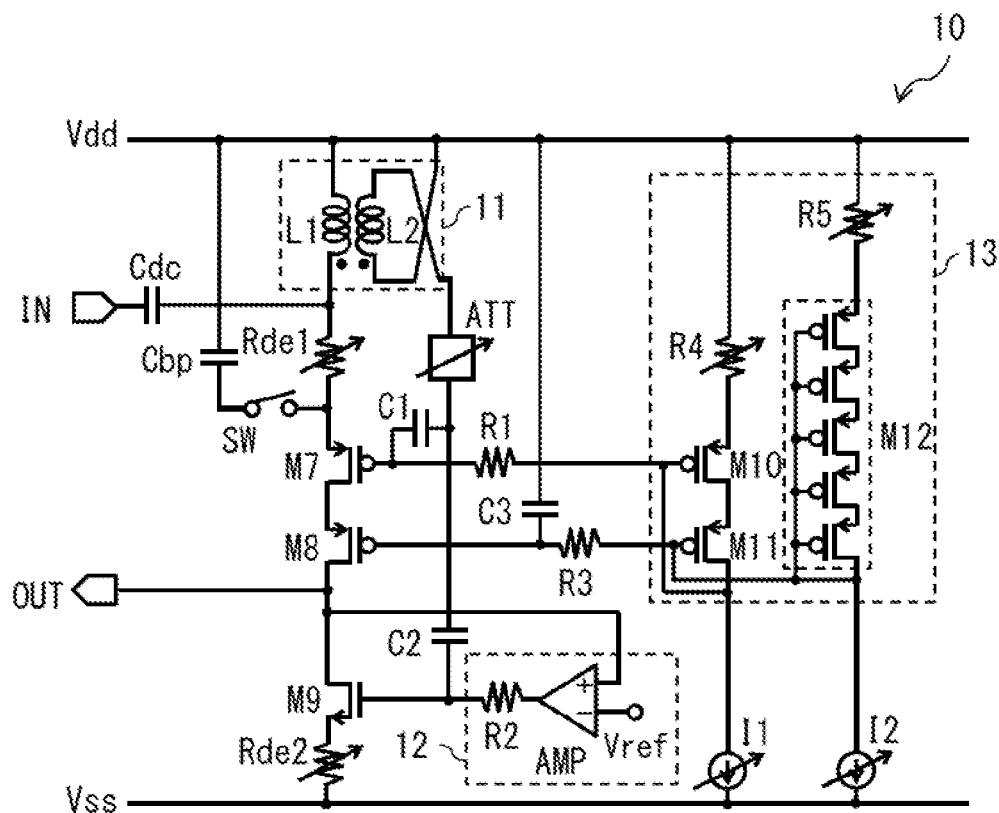

[ FIG. 5 ]
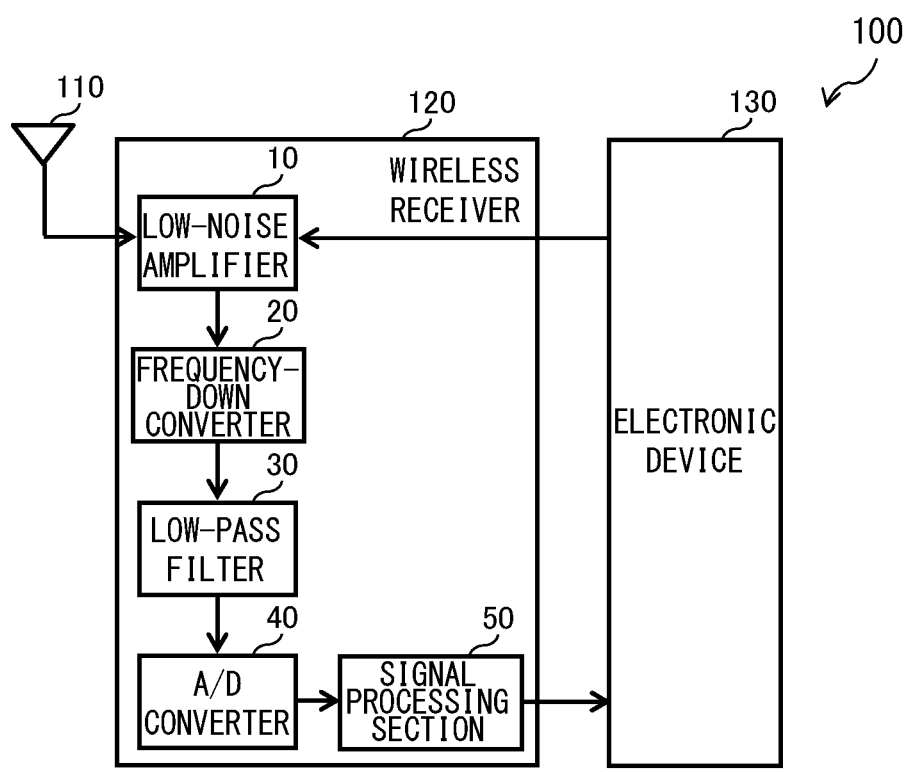

[ FIG. 6 ]
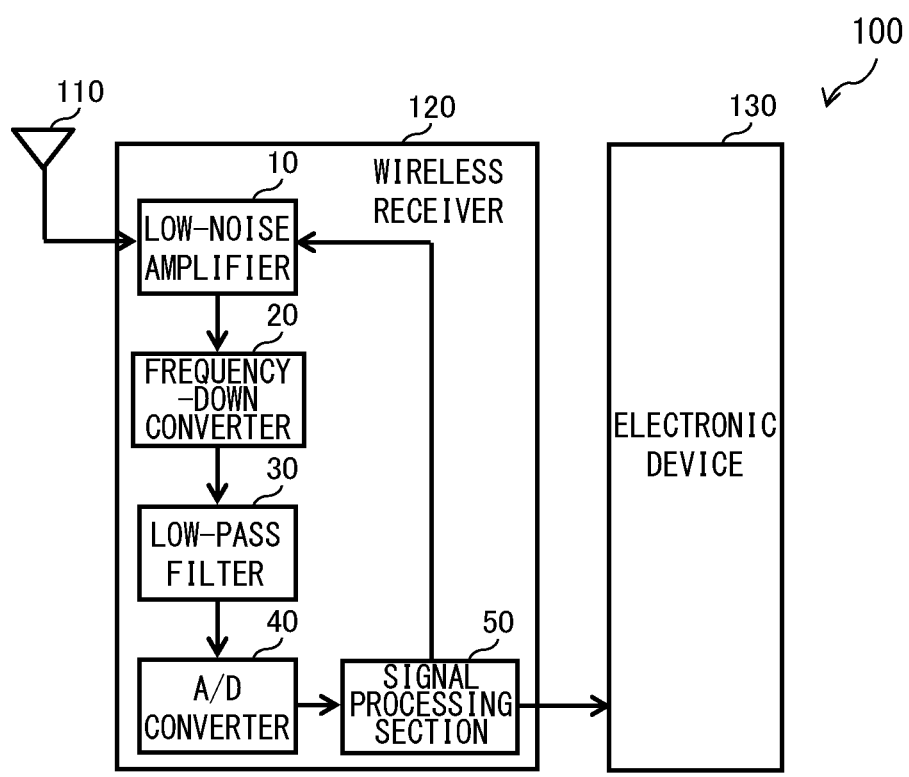

AMPLIFIER AND SIGNAL PROCESSING APPARATUS

CROSS REFERENCE TO RELATED APPLICATIONS

This application is a U.S. National Phase of International Patent Application No. PCT/JP2020/029404 filed on Jul. 31, 2020, which claims priority benefit of Japanese Patent Application No. JP 2019-158605 filed in the Japan Patent Office on Aug. 30, 2019. Each of the above-referenced applications is hereby incorporated herein by reference in its entirety.

TECHNICAL FIELD

The present disclosure relates to an amplifier and a signal processing apparatus.

BACKGROUND ART

An amplifier is used to amplify a weak signal in, for example, a receiver of a wireless signal. For example, Patent Literature 1 and Non-Patent Literature 1 disclose measures for improving a gain and a receiving sensitivity of the amplifier.

CITATION LIST

Patent Literature

Patent Literature 1: International Publication WO2016/152267

Non-Patent Literature

Non-Patent Literature 1: Gm-Boosted Common-Gate LNA and Differential Colpitts VCO #QVCO in 0.18 um CMOS, IEEE Journal of Solid-State Circuits (Vol. 40, Issue 12, December 2005)

SUMMARY OF THE INVENTION

Incidentally, it is desirable that an amplifier described above be able to perform a low voltage operation, be able to control the amplifier to an appropriate gain even upon an excessive input, and be able to obtain a high linearity. It is desirable to provide an amplifier and a signal processing apparatus that make it possible to perform a low voltage operation, control the amplifier to an appropriate gain even upon an excessive input, and obtain a high linearity.

An amplifier according to one embodiment of the present disclosure includes a P-type transistor and an N-type transistor that are connected in series, an operation amplifier, a transformer, and a variable attenuator. The operation amplifier has an output terminal, an inverting input terminal, and a non-inverting input terminal. In the operation amplifier, the output terminal is coupled to a gate side of one of the P-type transistor and the N-type transistor, one of the inverting input terminal and the non-inverting input terminal is coupled to drain sides of both of the P-type transistor and the N-type transistor, and a reference voltage is to be applied to the other of the inverting input terminal and the non-inverting input terminal. The transformer has a primary coil and a secondary coil. In the transformer, the primary coil is coupled to a source side of one of the P-type transistor and the N-type transistor. The variable attenuator is provided between the secondary coil and gate terminals of both of the N-type transistor and the P-type transistor.

A signal processing apparatus according to one embodiment of the present disclosure includes the amplifier described above and a controller that controls the amplifier. The controller controls the variable attenuator by a control signal corresponding to a reception level of a signal outputted from the amplifier, or a reception level of a signal generated on the basis of the signal outputted from the amplifier.

In the amplifier and the signal processing apparatus according to one embodiment of the present disclosure, the transformer is provided in which the primary coil is coupled to the source side of one of the P-type transistor and the N-type transistor, and the variable attenuator is provided between the secondary coil and the gate terminals of both of the N-type transistor and the P-type transistor. Hence, it is possible to attenuate an output of the secondary coil of the transformer by the variable attenuator upon an excessive input, and to improve a linearity of the amplifier. In addition, it is also possible to protect the amplifier from the excessive input.

BRIEF DESCRIPTION OF THE DRAWINGS

FIG. 1 is a diagram illustrating an example of a circuit configuration of a low-noise amplifier according to a first embodiment of the present disclosure.

FIG. 2 is a diagram illustrating an example of a circuit configuration of a variable attenuator of FIG. 1.

FIG. 3 is a diagram illustrating control signals to be inputted to the variable attenuator of FIG. 2 and an example of an attenuation amount corresponding to the control signals.

FIG. 4 is a diagram illustrating a modification example of the circuit configuration of the low-noise amplifier of FIG. 1.

FIG. 5 is a diagram illustrating an example of functional blocks of a signal processing apparatus according to a second embodiment of the present disclosure.

FIG. 6 is a diagram illustrating a modification example of the functional blocks of the signal processing apparatus of FIG. 5.

MODES FOR CARRYING OUT THE INVENTION

Hereinafter, an embodiment of the present disclosure is described in detail with reference to the drawings. The description will be made in the following order.
1. First Embodiment (a low-noise amplifier)
2. Modification Example (a low-noise amplifier)
3. Second Embodiment (a signal processing apparatus)

1. First Embodiment

[Configuration]

A low-noise amplifier 10 according to a first embodiment of the present disclosure will be described. FIG. 1 illustrates an example of a circuit configuration of a low-noise amplifier 10. The Low-noise amplifier 10 includes an input terminal IN, an output terminal OUT, a capacitor Cdc, a transformer 11, a common mode feedback circuit 12, a bias voltage supplying section 13, N-type transistors M1 and M3, and a P-type transistor M2. The low-noise amplifier 10 further includes a variable attenuator ATT, source degeneration resistors Rde1 and Rde2, a bypass capacitor Cbp, and a switch SW.

The N-type transistor M1 corresponds to one concrete example of an "N-type transistor" of the present disclosure. The P-type transistor M2 corresponds to one concrete example of a "P-type transistor" of the present disclosure. The transformer 11 corresponds to one concrete example of a "transformer" of the present disclosure. The variable attenuator ATT corresponds to one concrete example of a "variable attenuator" of the present disclosure. The source degeneration resistor Rde1 corresponds to one concrete example of a "source degeneration resistor" of the present disclosure. The bypass capacitor Cbp corresponds to one concrete example of a "bypass capacitor" of the present disclosure. The switch SW corresponds to one concrete example of a "switch" of the present disclosure.

The common mode feedback circuit 12 has a resistor R2 and an operation amplifier AMP. The operation amplifier AMP corresponds to one concrete example of an "operation amplifier" of the present disclosure. The operation amplifier AMP has an output terminal, an inverting input terminal (−) and a non-inverting input terminal (+). In the operation amplifier AMP, the output terminal is coupled to a gate side of the P-type transistor M2, the non-inverting input terminal (+) is coupled to drain sides of both of the P-type transistor M2 and the N-type transistor M1, and a reference voltage Vref is to be applied to the inverting input terminal (−). The resistor R2 is coupled to the output terminal of the operation amplifier AMP, and the output terminal of the operation amplifier AMP is coupled to a gate of the P-type transistor M2 via the resistor R2. The resistor R2 is coupled to the output terminal of the operation amplifier AMP and to the gate side of the P-type transistor M2. That is, the resistor R2 is provided between the output terminal of the operation amplifier AMP and the gate terminal of the P-type transistor M2. The non-inverting input terminal (+) of the operation amplifier AMP is coupled to a drain of the P-type transistor M2 and a drain of the N-type transistor M3.

The bias voltage supplying section 13 supplies a bias voltage to the gates of the N-type transistors M1 and M3. The bias voltage supplying section 13 includes, for example, variable resistors R4 and R5, N-type transistors M4 and M5, and an N-type transistor group M6. In the N-type transistor group M6, a plurality N-type transistors is coupled in series. The N-type transistors M4 and M5 and the variable resistor R4 are coupled in series. A source of the N-type transistor M5 is coupled to a drain of the N-type transistor M4, and the variable resistor R4 is coupled to a source of the N-type transistor M4. A gate of the N-type transistor M5 is coupled via a resistor R3 to the gate of the N-type transistor M3. A gate of the N-type transistor M4 is coupled to the gate of the N-type transistor M1 via the resistor R1. Gate sides of both of the N-type transistors M4 and M5 and a drain side of the N-type transistor M5 are coupled to a variable current source I1. In the N-type transistor group M6, a drain side of a most upstream N-type transistor is coupled to a variable current source I2, and a source side of a most downstream N-type transistor is coupled to the variable resistor R5 and is further coupled via the variable resistor R5 to a power supply line to which a power supply voltage Vss is applied. In the N-type transistor group M6, gates of all of N-type transistors are coupled to a drain side of a most upstream N-type transistor in the N-type transistor group M6 and to the gate side of the N-type transistor M5, and are further coupled to the variable current source I2. In the N-type transistor group M6, all of the N-type transistor are configured by, for example, MOS transistors.

The P-type transistor M2 and the N-type transistor M1 are coupled in series via the N-type transistor M3 to increase a reverse isolation characteristic of the low-noise amplifier 10. A source side of the P-type transistor M2 is coupled to the source degeneration resistor Rde2, and is further coupled via the source degeneration resistor Rde2 to a power supply line to which a power supply voltage Vdd is applied. A drain side of the P-type transistor M2 is coupled to a drain side of the N-type transistor M3, and is further coupled via the N-type transistor M3 to a drain side of the N-type transistor M1. A source side of the N-type transistor M1 is coupled to the source degeneration resistor Rde1, and is further coupled via the source degeneration resistor Rde1 to a primary coil L1 of the transformer 11. That is, the source degeneration resistor Rde1 is provided between the source of the N-type transistor M1 and the primary coil L1 of the transformer 11. A drain side of the N-type transistor M1 is coupled to a source side of the N-type transistor M3. The N-type transistors M1 and M2 and the P-type transistor M2 are configured by, for example, MOS transistors.

The source degeneration resistors Rde1 and Rde2 are variable resistors. The source degeneration resistors Rde1 and Rde2 are configured to be relatively low in resistance when an excessive input is absent. The source degeneration resistors Rde1 and Rde2 are configured to be relatively high in resistance when the excessive input is present.

The transformer 11 has the primary coil L1 and a secondary coil L2. The transformer 11 may be an air core or may have a magnetic core. The primary coil L1 and the secondary coil L2 may be formed using a metal wiring layer on a semiconductor wafer or on an interposer substrate, or may be provided outside a semiconductor chip. A turn ratio of the primary coil L1 and the secondary coil L2 is 1:N (where N>1 and N is a real number). That is, the transformer 11 is a step-up transformer. In the transformer 11, the primary coil L1 is coupled to the source degeneration resistor Rde1, and is further coupled via the source degeneration resistor Rde1 to the source side of the N-type transistor M1. A path that couples the primary coil L1 and the source degeneration resistor Rde1 is coupled to the capacitor Cdc, and is coupled via the capacitor Cdc to the input terminal IN. Accordingly, the capacitor Cdc has a function of blocking a direct-current component included in a signal to be inputted to the input terminal IN.

In the transformer 11, the secondary coil L2 is coupled to the variable attenuator ATT. The secondary coil L2 is further coupled, via the variable attenuator ATT and the capacitor C2, to the gate side of the P-type transistor M2 and the resistor R2. That is, the variable attenuator ATT is provided between the secondary coil L2 of the transformer 11 and the gate terminal of the P-type transistor M2 and further between the secondary coil L2 of the transformer 11 and the output terminal of the operation amplifier AMP. In the variable attenuator ATT, a terminal on an output terminal side of the operation amplifier AMP is coupled to the capacitor C1, and is further coupled via the capacitor C1 to the gate side of the N-type transistor M1. That is, the variable attenuator ATT is provided between the secondary coil L2 of the transformer 11 and the gate terminal of the N-type transistor M1.

The bypass capacitor Cbp is coupled to the source side of the N-type transistor M1, and is coupled in parallel with the path that includes the source degeneration resistor Rde1 and the primary coil L1 of the transformer 11. The switch SW is provided between the bypass capacitor Cbp and the source terminal of the N-type transistor M1. The switch SW disconnects an electrical connection between the source side of the N-type transistor M1 and the bypass capacitor Cbp when the excessive input is absent. The switch SW electrically couples the source side of the N-type transistor M1 and the bypass capacitor Cbp when the excessive input is present. As a result, when the excessive input is present, the source of the N-type transistor M1 is AC-grounded by the bypass capacitor Cbp. It should be noted that, in a case where the bypass capacitor Cbp is not provided, a signal inputted from the input terminal IN is fed through to the source terminals of the N-type transistor M1 and the P-type transistor M2 without passing through the variable attenuator ATT, in which case there is a possibility that an enough attenuation amount may not be obtained.

FIG. 2 illustrates an example of a circuit configuration of the variable attenuator ATT. The variable attenuator ATT is, for example, a capacitor-type attenuator configured by a plurality of capacitors. The variable attenuator ATT is not limited to the capacitor-type attenuator, and may be, for example, a resistor-type attenuator. It should be noted that the resistor-type attenuator can lower a Q-factor of the connected transformer. Further, a noise generated by the resistor can deteriorate a noise characteristic. Accordingly, as the variable attenuator ATT, the capacitor-type attenuator is more desirable than the resistor-type attenuator.

The variable attenuator ATT is configured to be set to pass-through (an attenuation amount of 0 dB) or to be low in attenuation amount when the excessive input is absent. The variable attenuator ATT is configured to be set to be high in attenuation amount when the excessive input is present. The variable attenuator ATT has, for example, an input terminal IN1, an output terminal OUT1, a plurality of capacitors coupled in the form of a 2C-C ladder type between the input terminal IN1 and the output terminal OUT1, and switches SW1 to SW6 configured by a plurality of N-type transistors for selecting and outputting one of outputs of the respective stages of the ladder. The variable attenuator ATT further includes, for example, a switch SW7 for a pass-through configured by a N-type transistor coupled in series between the input terminal IN1 and the output terminal OUT1, and a wiring line La that couples terminals of the respective capacitors which are not coupled to the input terminal IN1, the output terminal OUT1, and the N-type transistor and the power supply line to which the power supply voltage Vss is applied. Here, an on resistance of the N-type transistor is generally smaller than that of the P-type transistor. Hence, it is possible to lower an insertion loss of the variable attenuator ATT by using the N-type transistor in the variable attenuator ATT as compared with that by using the P-type transistor.

FIG. 3 illustrates control signals SEL1 to SEL7 to be inputted to the variable attenuator ATT of FIG. 2 and an example of an attenuation amount corresponding to the control signals SEL1 to SEL7. The variable attenuator ATT serves as an attenuator of −36 dB as a result of turning of only the control signal SEL1 into a Hi level, for example. The variable attenuator ATT serves as an attenuator of −30 dB as a result of turning of only the control signal SEL2 into a Hi level, for example. The variable attenuator ATT serves as an attenuator of −24 dB as a result of turning of only the control signal SEL3 into a Hi level, for example. The variable attenuator ATT serves as an attenuator of −18 dB as a result of turning of only the control signal SEL4 into a Hi level, for example. The variable attenuator ATT serves as an attenuator of −12 dB as a result of turning of only the control signal SEL5 into a Hi level, for example. The variable attenuator ATT serves as an attenuator of −6 dB as a result of turning of only the control signal SEL6 into a Hi level, for example. The variable attenuator ATT serves as an attenuator of 0 dB as a result of turning of only the control signal SEL7 into a Hi level, for example.

The bias voltage supplying section 13 supplies a constant bias voltage V_BIAS1 to the gate of the N-type transistor M3, and supplies a constant bias voltage V_BIAS2 to the gate of the N-type transistor M1. The unit of the bias voltages V_BIAS1 and V_BIAS2 is, for example, volt (V). Hereinafter, this applies similarly to the unit of any other voltage. Aspect ratios of the transistors M4, M5, and M6, a resistance value R_Rde1 of the source degeneration resistance Rde1, resistance values R_R4 and R_R5 of the variable resistors R4 and R5, and current values I_I1 and I_I2 of the variable current sources I1 and I2 shall be set so that the bias voltages V_BIAS1 and V_BIAS2 respectively satisfy the following expressions (1) and (2).

$$V\_BIAS1 = V\_SAT + V\_T + R\_R4 \times I\_I1 \tag{1}$$

$$V\_BIAS2 = 2 \times V\_SAT + V\_T + R\_R5 \times I\_I2 \tag{2}$$

In the expressions (1) and (2), VT is a threshold voltage of the N-type transistors M1 and M3. V_SAT is a saturation drain voltage of the N-type transistors M1 and M3 and the P-type transistor M2. In the expressions (1) and (2), it is assumed that respective threshold voltages of the N-type transistors M1 and M3 and the P-type transistor M2 are the same, and the respective saturation drain voltages of the N-type transistors M1 and M3 and the P-type transistor M2 are the same.

Further, the voltage V_R for the resistance value R_Rde1 of the source degeneration resistor Rde1 and the resistance values R_R4 and R_R5 of the variable resistors R4 and R5 shall be set to satisfy the expression (3). In the expression (3), I_BIAS is a drain bias current of the N-type transistors M1 and M3 and the P-type transistor M2.

$$V\_R = R\_Rde1 \times I\_BIAS = R\_R4 \times I\_I1 = R\_R5 \times I\_I2 \tag{3}$$

Based on the expression (3), it is possible to transform the expressions (1) and (2) into the following expressions (4) and (5), respectively.

$$V\_BIAS1 = V\_SAT + V\_T + R\_Rde1 \times I\_BIAS \tag{4}$$

$$V\_BIAS2 = 2 \times V\_SAT + V\_T + R\_Rde1 \times I\_BIAS \tag{5}$$

When the bias voltages V_BIAS1 and V_BIAS2 described above are supplied to the gates of the N-type transistors M1 and M3, the voltage (an output voltage) V_OUT of the output terminal OUT is a value obtained by the following expression (6).

$$V\_OUT = 2 \times V\_SAT + R\_Rde1 \times I\_BIAS \tag{6}$$

In the above-described configuration, a direct-current component of an RF signal is cut by the capacitors Cdc, C1, and C2, and an alternating-current signal component is inputted to the gates of the N-type transistor M1 and the P-type transistor M2 via the transformer 11 and the variable attenuator ATT. This signal component is weak, and a potential of the gates of the N-type transistor M1 and the P-type transistor M2 is a low level. In this case, the P-type transistor M2 makes a transition to the on-state and operates in a saturation region. On the other hand, the N-type transistors M1 and M3 also make a transition to the on-state by the application of the bias voltages V_BIAS1 and V_BIAS2. These P-type transistor M2 and N-type transistors M1 and M3 amplify the signal component.

Here, in order to operate the N-type transistors M1 and M3 and the P-type transistor M2 in the on-state, it is necessary for the power supply voltage Vdd to satisfy the following expression (7). In the expression (7), Rde2 is a resistance value of the source degeneration resistor Rde2.

$$Vdd-(R\_Rde2 \times I\_BIAS)-V\_OUT \geq V\_SAT \quad (7)$$

In addition, when the P-type transistor M2 is in the on-state, the output terminal of the operation amplifier AMP is coupled to the non-inverting input terminal (+) via the P-type transistor M2, and a virtual short circuit is formed between the non-inverting input terminal (+) and the inverting input terminal (−). Thus, a voltage of the non-inverting input terminal (+) and a voltage of the inverting input terminal (−) become the same, thereby establishing the following expression (8).

$$V\_OUT=Vref \quad (8)$$

In a case where a value of the expression (6) is set to the reference voltage Vref of the above expression, it is possible to replace a value of the expression (8) by the following expression (9). Substituting the expression (9) into the expression (7) yields the expression (10).

$$V\_OUT=2 \times V\_SAT+R\_Rde1 \times I\_BIAS \quad (9)$$

$$Vdd \geq 3 \times V\_SAT+(R\_Rde1+R\_Rde2) \times I\_BIAS \quad (10)$$

Here, if the common mode feedback circuit 12 is not provided, it is necessary for the power supply voltage Vdd to satisfy the following expression (11).

$$Vdd \geq 3 \times V\_SAT+(R\_Rde1+R\_Rde2) \times I\_BIAS+V\_T \quad (11)$$

From the expression (11), a minimum operating voltage in a case where no common mode feedback circuit 12 is provided is $3 \times V\_SAT+(R\_Rde1+R\_Rde2) \times I\_BIAS+V\_T$. For example, the minimum operating voltage is 0.7 V, in a case where the saturation drain voltage V_SAT is 0.1 V, the threshold voltage V_T is 0.3 V, the resistance values R_Rde1 and R_Rde2 are 1 kΩ, and the bias current I_BIAS is 50 uA. On the other hand, in the low-noise amplifier 10 provided with the common mode feedback circuit 12, the minimum operating voltage is $3 \times V\_SAT+(R\_Rde1+R\_Rde2) \times I\_BIAS$ (=0.4 V) from the expression (10), which is extremely lower than 0.7 V of a case where the common mode feedback circuit 12 is not provided. In an actual circuit, a value obtained by adding a margin to a theoretical minimum operating voltage ($3 \times V\_SAT+(R\_Rde1+R\_Rde2) \times I\_BIAS$) is used as the power supply voltage Vdd. However, even if the margin is considered, it is possible to operate the low-noise amplifier 10 with a margin at a very low voltage such as 0.6 V or 0.7 V.

In addition, when the excessive input is absent, the terms of $(R\_Rde1+R\_Rde2) \times I\_BIAS$ disappear by setting the resistance values R_Rde 1 and R_Rde2 to 0Ω in the expression (10), and it is possible to express the minimum operating voltage by the following expression (12). In this case, the source degeneration resistors Rde1 and Rde2 do not limit a voltage, allowing more bias current I_BIAS to flow and thereby making it possible to improve a characteristic such as a gain or a noise.

$$Vdd \geq 3 \times V\_SAT \quad (12)$$

It should be noted that the capacitor Cdc for cutting a direct-current component may be provided outside the low-noise amplifier 10. In this case, for example, the capacitor Cdc is inserted between the antenna and the input terminal IN. Further, the bias voltage supplying section 13 may be provided outside the low-noise amplifier 10. Moreover, a configuration may be employed in which the bias voltages V_BIAS1 and V_BIAS2 are not applied to the gates of the N-type transistors M1 and M3. In this case, it is not necessary to provide the bias voltage supplying section 13. However, in this configuration, the N-type transistors M1 and M3 and the P-type transistor M2 operate as inverters and function as an amplifier only in the vicinity of inverted voltages. Accordingly, it is desirable that the bias voltage supplying section 13 be provided.

[Effect]

Next, effects of the low-noise amplifier 10 according to the present embodiment will be described.

Non-Patent Literature 1 described above discloses that a gate-grounded type low-noise amplifier is fed forward by an on-chip transformer. This low-noise amplifier has a higher linearity owing to a low-impedance input. In addition, it is possible to achieve a relatively low noise factor by a noise-suppressing effect configured by a feed-forward path via the transformer. Although the specific application is not explicitly described in Non-Patent Literature 1, application to a wireless standard or the like in which a dynamic range of a received signal is large is conceivable.

However, in the above Non-Patent Literature 1, means for a gain control is not implemented, and a voltage of large amplitude is generated at a gate of a transistor by a voltage-increasing action of the transformer at the time of an excessive input (e.g., −10 dBm or greater), decreasing a linearity downstream of the receiver. In addition, if the voltage is raised by the transformer, a gate oxide film of the transistor may be broken by overvoltage at the time of the excessive input. This can be a more serious issue upon a low voltage operation due to a fine process of recent years.

Further, Patent Literature 1 described above discloses a low-noise amplifier having a circuit configuration suitable for a low voltage operation. This configuration makes it possible to decrease a gain by reducing a bias current. However, reducing the bias current reduces a dynamic range of a circuit at the same time and is not suitable from a viewpoint of improving the linearity.

In contrast, in the present embodiment, the transformer 11 in which the primary coil L1 is coupled to the source side of the N-type transistor M1 is provided, and the variable attenuator ATT is provided between the secondary coil L2 and the gate terminals of both of the N-type transistor M1 and the P-type transistor M2.

Incidentally, a primary side of the transformer 11 is matched to 50Ω and is low in impedance. Accordingly, it is necessary to use a small resistor of several Ω to several tens of Ω for the resistor structuring the variable attenuator in a case where the variable attenuator is provided on the primary side of the transformer 11. Therefore, in this case, it is difficult to divide a voltage inputted to the input terminal IN accurately by using the variable attenuator. In addition, in a case where a small resistor of several Ω to several tens of Ω is used for the resistor structuring the variable attenuator, it is necessary to connect a large number of small resistors in parallel. However, when a large number of small resistors are mounted on an integrated circuit, a proportion of a large number of resistors occupying the integrated circuit becomes large. Further, an insertion loss upon pass-through (a zero attenuation amount) of the variable attenuator when the variable attenuator is provided on the primary side of the transformer 11 becomes larger than the insertion loss upon the pass-through (the zero attenuation amount) of the variable attenuator ATT when the variable attenuator ATT is provided on a secondary side of the transformer 11.

In contrast, the secondary side of the transformer 11 is high in impedance, eliminating the necessity of matching to 50Ω. In addition, it is possible to use a large resistor of several hundred Ω or greater for the resistor structuring the variable attenuator ATT in a case where the variable attenuator ATT is provided on the secondary side of the transformer 11. Therefore, it is possible to divide the voltage inputted to the input terminal IN accurately by using the variable attenuator ATT. Further, it is possible to use not only the resistor-type attenuator but also the capacitor-type attenuator for the variable attenuator ATT. Accordingly, a degree of freedom in designing the variable attenuator ATT is high.

Therefore, providing the variable attenuator ATT on the secondary side of the transformer 11 makes it possible to attenuate the output of the secondary coil L2 of the transformer 11 by the variable attenuator ATT upon the excessive input, and thereby to improve the linearity of the low-noise amplifier 10. It is also possible to protect the low-noise amplifier 10 from the excessive input. As a result, it is possible to control the low-noise amplifier 10 to an appropriate gain and to achieve the high linearity in the low-noise amplifier 10 even upon the excessive input, and to protect the gate oxide film of the N-type transistor M1 from the excessive input as well. In addition, it is also possible to reduce the insertion loss upon the pass-through (the zero attenuation amount) of the variable attenuator ATT and to keep a low noise characteristic.

Further, in the present embodiment, the source degeneration resistor Rde1 is provided between the primary coil L1 of the transformer 11 and the source of the N-type transistor M1. The source degeneration resistor Rde1 is configured to be low in resistance when the excessive input is absent.

Incidentally, a transistor based on a fine process of recent years is very high in gain even with a low bias current. Accordingly, it is difficult to obtain a necessary variable-gain range simply by narrowing the bias current. There is a method of separately providing a shunt path at an output terminal of a low-noise amplifier to attenuate a signal. However, this method increases a parasitic capacitance due to an addition of a circuit. Moreover, even if a signal is attenuated by an output of the low-noise amplifier, this does not lead to an improvement in linearity of the low-noise amplifier.

In contrast, providing the source degeneration resistor Rde1 between the primary coil L1 of the transformer 11 and the source of the N-type transistor M1 makes it possible to lower a transconductance of the N-type transistor M1. Therefore, it is possible to suppress an increase in the parasitic capacitance as compared with a case where the shunt path is separately provided at the output terminal of the low-noise amplifier and further to increase the linearity of the low-noise amplifier 10.

In addition, in the present embodiment, the bypass capacitor Cbp coupled to the source side of the N-type transistor M1 and connected in parallel with the path that includes the source degeneration resistor Rde1 and the primary coil L1 of the transformer 11 is provided. Thus, for example, when the excessive input is present, the source of the N-type transistor M1 is AC-grounded by the bypass capacitor Cbp. As a result, it is possible to sufficiently attenuate a signal inputted from the input terminal IN when the excessive input is present.

Further, in the present embodiment, the variable attenuator ATT is provided configured to be set to the pass-through (the attenuation amount of 0 dB) or to be low in attenuation amount when the excessive input is absent. Thus, for example, it is possible to relatively increase the attenuation amount of the variable attenuator ATT in a case where a reception level is higher than a predetermined threshold value, and it is possible to relatively decrease the attenuation amount of the variable attenuator ATT in a case where the reception level is equal to or less than the threshold value. Therefore, for example, it is possible to maintain a low noise property by causing the variable attenuator ATT to perform the pass-through in which the attenuation amount is made relatively small upon an input of a small signal. In addition, a loss at the time of the pass-through is small as compared with a case where an attenuator is inserted immediately after the input terminal IN, making it possible to increase a degree of freedom of designing.

Further, in the present embodiment, the switch SW is provided that disconnects the electrical connection between the bypass capacitor Cbp and the source side of the N-type transistor M1 when the excessive input is absent. Thus, for example, in a case where the reception level is higher than a predetermined threshold value, the switch SW is turned on and the source of the N-type transistor M1 is AC-grounded by the bypass capacitor Cbp, making it possible for the variable attenuator ATT to obtain the sufficient attenuation amount with respect to an alternating-current signal. On the other hand, for example, in a case where the reception level is equal to or lower than the threshold value, it is possible to prevent the alternating-current signal from being attenuated by the bypass capacitor Cbp by turning off the switch SW to disconnect the electric connection between the bypass capacitor Cbp and the source of the N-type transistor M1. Accordingly, it is possible to control the feedforward by the transformer 11 in response to the reception level.

2. Modification Example

In the above embodiment, the low-noise amplifier 10 may be configured by, for example, a circuit in which the circuit between the power supply lines Vdd and Vss illustrated in FIG. 1 is inverted vertically as illustrated in FIG. 4. In this case, the N-type transistors M1 and M3 are replaced by P-type transistors M7 and M8 and the P-type transistor M2 is replaced by an N-type transistor M9. In addition, the N-type transistors M4 and M5 are replaced by P-type transistors M10 and M11 and the N-type transistor group M6 is replaced by a P-type transistor group M12. Even in such a case, effects similar to those of the above first embodiment are obtained.

3. Second Embodiment

Next, a signal processing apparatus 100 according to a second embodiment of the present disclosure will be described. FIG. 5 illustrates an example of a circuit configuration of the signal processing apparatus 100. The signal processing apparatus 100 includes, for example, an antenna 110, a wireless receiver 120 and an electronic device 130. The electronic device 130 corresponds to one concrete example of a "controller" of the present disclosure. The wireless receiver 120 includes, for example, the low-noise amplifier 10 according to the above-described embodiment and its modification example (hereinafter, simply referred to as the "low-noise amplifier 10"), a frequency-down converter 20, a low-pass filter 30, an A/D converter 40, and a signal processing section 50.

The input terminal IN of the low-noise amplifier 10 is coupled to the antenna 110, and a signal outputted from the signal processing section 50 is inputted to the electronic device 130, and a control signal outputted from the electronic device 130 is inputted to the low-noise amplifier 10. The variable attenuator ATT, the source degeneration resistors Rde1 and Rde2, the switch SW, the variable current sources I1 and I2, and the variable resistors R4 and R5 included in the low-noise amplifier 10 (hereinafter simply referred to as "controlled devices") are controlled by the control signal outputted from the electronic device 130.

The frequency-down converter 20 converts an RF signal outputted from the low-noise amplifier 10 into a signal (such as a baseband signal) having a frequency lower than that of the RF signal. The frequency-down converter 20 outputs the converted baseband signal to the A/D converter 40 via the low-pass filter 30. The low-pass filter 30 removes a high-frequency noise included in the RF signal. The AD converter 40 converts the analog baseband signal into a digital signal and outputs the digital signal to the signal processing section 50. The signal processing section 50 performs predetermined signal processing, such as demodulation processing, on the digital signal. The signal processing section 50 outputs a processed demodulated signal to the electronic device 130.

The electronic device 130 detects, as a reception level, a level of a signal outputted from the low-noise amplifier 10 (specifically, signals outputted from the drain sides of both of the P-type transistor M2 and the N-type transistor M1) or a level of a signal generated on the basis of the signal outputted from the low-noise amplifier 10. Further, the electronic device 130 controls the low-noise amplifier 10 (for example, the controlled devices including the bias voltage supplying section 13 and the variable attenuator ATT) by the control signal corresponding to the detected reception level.

The electronic device 130 controls the bias voltages V_BIAS1 and V_BIAS2 in the low-noise amplifier 10 by, for example, the control signal corresponding to the detected reception level. The electronic device 130 relatively decreases the bias voltages V_BIAS1 and V_BIAS2 by reducing the current value of the variable current sources I1 and I2, in a case where, for example, the reception level is higher than a predetermined threshold value. Thus, although a characteristic such as a gain or a noise factor of the low-noise amplifier 10 decreases, it is possible to reduce a consumption current of the low-noise amplifier 10. On the other hand, in a case where the reception level is equal to or less than the threshold value, the electronic device 130 relatively increases the bias voltages V_BIAS1 and V_BIAS2 by increasing the current value of the variable current sources I1 and I2. Thus, although the consumption current of the low-noise amplifier 10 increases, the characteristic such as the gain improves.

The electronic device 130 controls the attenuation amount of the variable attenuator ATT by, for example, the control signal corresponding to the detected reception level. The electronic device 130 outputs, to the low-noise amplifier 10, the control signal that relatively increases the attenuation amount of the variable attenuator ATT, in a case where, for example, the reception level is higher than a predetermined threshold value. Thus, the attenuation amount of the variable attenuator ATT becomes relatively large, making it possible to reduce the consumption current of the low-noise amplifier 10. On the other hand, in a case where the reception level is equal to or less than the threshold value, the electronic device 130 outputs, to the low-noise amplifier 10, the control signal that relatively decreases the attenuation amount of the variable attenuator ATT. Thus, the attenuation amount of the variable attenuator ATT becomes relatively small, improving a characteristic such as the gain although the consumption current of the low-noise amplifier 10 becomes large.

The electronic device 130 controls the switch SW by, for example, the control signal corresponding to the detected reception level. The electronic device 130 outputs, to the low-noise amplifier 10, the control signal that turns on the switch SW, in a case where, for example, the reception level is higher than a predetermined threshold value. Thus, the switch SW is turned on, and the source of the N-type transistor M1 is AC-grounded by the bypass capacitor Cbp. As a result, it is possible for the variable attenuator ATT to obtain the sufficient attenuation amount with respect to an alternating-current signal. On the other hand, in a case where the reception level is equal to or less than the threshold value, the electronic device 130 outputs, to the low-noise amplifier 10, the control signal that turns off the switch SW. Thus, the switch SW is turned off, and the electric connection between the bypass capacitor Cbp and the source of the N-type transistor M1 is disconnected. As a result, it is possible to prevent the alternating-current signal from being attenuated by the bypass capacitor Cbp.

The electronic device 130 controls the source degeneration resistors Rde1 and Rde2 by, for example, the control signal corresponding to the detected reception level. The electronic device 130 outputs, to the low-noise amplifier 10, the control signal that relatively increases the resistance values of the source degeneration resistors Rde1 and Rde2, in a case where, for example, the reception level is higher than a predetermined threshold value. Thus, it is possible to relatively increase the resistance values of the source degeneration resistors Rde1 and Rde2. As a result, it is possible to obtain the sufficient attenuation amount without impairing the linearity of the low-noise amplifier 10.

In the present embodiment, the wireless receiver 120 is provided with the low-noise amplifier 10. Thus, effects similar to those of the above first embodiment are obtained.

In addition, in the present embodiment, the variable attenuator ATT is controlled by the control signal corresponding to the reception level of a signal outputted from the low-noise amplifier 10, or the reception level of a signal generated on the basis of the signal outputted from the low-noise amplifier 10. Thus, for example, it is possible to relatively increase the attenuation amount of the variable attenuator ATT in a case where the reception level is higher than a predetermined threshold value, and it is possible to relatively decrease the attenuation amount of the variable attenuator ATT in a case where the reception level is equal to or less than the threshold value. Therefore, for example, it is possible to maintain a low noise property by causing the variable attenuator ATT to perform the pass-through in which the attenuation amount is made relatively small upon an input of a small signal. In addition, a loss at the time of the pass-through is small as compared with a case where an attenuator is inserted immediately after the input terminal IN, making it possible to increase a degree of freedom of designing.

In addition, in the present embodiment, the switch SW is controlled by the control signal corresponding to the reception level of a signal outputted from the low-noise amplifier 10, or the reception level of a signal generated on the basis of the signal outputted from the low-noise amplifier 10. Thus, for example, in a case where the reception level is higher than a predetermined threshold value, the switch SW is turned on and the source of the N-type transistor M1 is AC-grounded by the bypass capacitor Cbp, making it possible for the variable attenuator ATT to obtain the sufficient attenuation amount with respect to an alternating-current signal. On the other hand, for example, in a case where the reception level is equal to or lower than the threshold value, it is possible to prevent the alternating-current signal from being attenuated by the bypass capacitor Cbp by turning off the switch SW to disconnect the electric connection between the bypass capacitor Cbp and the source of the N-type transistor M1. Accordingly, it is possible to control the feedforward by the transformer 11 in response to the reception level.

In addition, in the present embodiment, the source degeneration resistors Rde1 and Rde2 are controlled by the control signal corresponding to the reception level of a signal outputted from the low-noise amplifier 10, or the reception level of a signal generated on the basis of the signal outputted from the low-noise amplifier 10. Thus, for example, in a case where the reception level is higher than a predetermined threshold value, it is possible to relatively increase the resistance values of the source degeneration resistors Rde1 and Rde2. Accordingly, it is possible to obtain the sufficient attenuation amount without impairing the linearity of the low-noise amplifier 10.

It should be noted that, in the present embodiment, the signal processing section 50 may detect a level of the digital signal inputted from the A/D converter 40 as the reception level. In this case, it is possible for the signal processing section 50 to control the controlled device including the bias voltage supplying section 13 and the variable attenuator ATT by the control signal in accordance with the detected reception level.

For example, as illustrated in FIG. 6, the signal processing section 50 controls the low-noise amplifier 10 (for example, the controlled devices including the bias voltage supplying section 13 and the variable attenuator ATT) by the control signal, in accordance with the detected reception level. The signal processing section 50 controls the bias voltages V_BIAS1 and V_BIAS2 in the low-noise amplifier 10 by the control signal, in accordance with the detected reception level, for example. The signal processing section 50 relatively decreases the bias voltages V_BIAS1 and V_BIAS2 by reducing the current value of the variable current sources I1 and I2, in a case where, for example, the reception level is higher than a predetermined threshold value. Thus, although a characteristic such as a gain or a noise factor of the low-noise amplifier 10 decreases, it is possible to reduce a consumption current of the low-noise amplifier 10. On the other hand, in a case where the reception level is equal to or less than the threshold value, the signal processing section 50 relatively increases the bias voltages V_BIAS1 and V_BIAS2 by increasing the current value of the variable current sources I1 and I2. Thus, although the consumption current of the low-noise amplifier 10 increases, the characteristic such as the gain improves.

The signal processing section 50 outputs, to the low-noise amplifier 10, the control signal that relatively increases the attenuation amount of the variable attenuator ATT, in a case where, for example, the reception level is higher than a predetermined threshold value. Thus, the attenuation amount of the variable attenuator ATT becomes relatively large, making it possible to reduce the consumption current of the low-noise amplifier 10. On the other hand, in a case where the reception level is equal to or less than the threshold value, the signal processing section 50 outputs, to the low-noise amplifier 10, the control signal that relatively decreases the attenuation amount of the variable attenuator ATT. Thus, the attenuation amount of the variable attenuator ATT becomes relatively small, improving a characteristic such as the gain although the linearity of the low-noise amplifier 10 decreases.

Further, the signal processing section 50 outputs, to the low-noise amplifier 10, the control signal that turns on the switch SW, in a case where, for example, the reception level is higher than a predetermined threshold value. Thus, the switch SW is turned on, and the source of the N-type transistor M1 is AC-grounded by the bypass capacitor Cbp. As a result, it is possible for the variable attenuator ATT to obtain the sufficient attenuation amount with respect to an alternating-current signal. On the other hand, in a case where the reception level is equal to or less than the threshold value, the signal processing section 50 outputs, to the low-noise amplifier 10, the control signal that turns off the switch SW. Thus, the switch SW is turned off, and the electric connection between the bypass capacitor Cbp and the source of the N-type transistor M1 is disconnected. As a result, it is possible to prevent the alternating-current signal from being attenuated by the bypass capacitor Cbp.

In addition, in the present embodiment, an electronic circuit, such as a wireless transmitter and audio equipment, provided with the low-noise amplifier 10 and the signal processing section 50 may be provided in place of the wireless receiver 120 that includes the low-noise amplifier 10 and the signal processing section 50. In this case, the signal processing section 50 processes the signal outputted from the low-noise amplifier 10 (specifically, the signals outputted from the drain sides of both of the P-type transistor M2 and the N-type transistor M1).

For example, the present disclosure may also be configured as follows.

(1)

An Amplifier Including:
- a P-type transistor and an N-type transistor that are connected in series;
- an operation amplifier having an output terminal, an inverting input terminal, and a non-inverting input terminal, the output terminal being coupled to a gate side of one of the P-type transistor and the N-type transistor, one of the inverting input terminal and the non-inverting input terminal being coupled to drain sides of both of the P-type transistor and the N-type transistor, a reference voltage being applied to the other of the inverting input terminal and the non-inverting input terminal;
- a transformer having a primary coil and a secondary coil, the primary coil being coupled to a source side of one of the P-type transistor and the N-type transistor; and
- a variable attenuator provided between the secondary coil and gate terminals of both of the N-type transistor and the P-type transistor.

(2)

The amplifier according to (1), further including a source degeneration resistor provided between the primary coil and a source of one of the P-type transistor and the N-type transistor.

(3)

The amplifier according to (2), further including a bypass capacitor coupled to the source side of one of the P-type transistor and the N-type transistor and connected in parallel with a path that includes the source degeneration resistor and the primary coil.

(4)
The amplifier according to any one of (1) to (3), in which the variable attenuator is configured to be set to pass-through or to be low in attenuation amount when an excessive input is absent.
(5)
The amplifier according to (2) or (3), in which the source degeneration resistor is configured to be set to be low in resistance when an excessive input is absent.
(6)
The amplifier according to (3), further including:
the bypass capacitor; and
a switch that disconnects an electrical connection between the bypass capacitor and the source side of one of the P-type transistor and the N-type transistor when an excessive input is absent.
(7)
The amplifier according to any one of (1) to (6), further including a resistor coupled to the output terminal of the operation amplifier and to the gate side of one of the P-type transistor and the N-type transistor.
(8)
A signal processing apparatus including:
an amplifier; and
a controller that controls the amplifier,
the amplifier including
a P-type transistor and an N-type transistor that are connected in series,
an operation amplifier having an output terminal, an inverting input terminal, and a non-inverting input terminal, the output terminal being coupled to a gate side of one of the P-type transistor and the N-type transistor, one of the inverting input terminal and the non-inverting input terminal being coupled to drain sides of both of the P-type transistor and the N-type transistor, a reference voltage being applied to the other of the inverting input terminal and the non-inverting input terminal,
a transformer having a primary coil and a secondary coil, the primary coil being coupled to a source side of one of the P-type transistor and the N-type transistor, and
a variable attenuator provided between the secondary coil and gate terminals of both of the N-type transistor and the P-type transistor, in which
the controller controls the variable attenuator by a control signal corresponding to a reception level of a signal outputted from the amplifier, or a reception level of a signal generated on the basis of the signal outputted from the amplifier.
(9)
The signal processing apparatus according to (8), in which the controller relatively increases an attenuation amount of the variable attenuator in a case where the reception level is greater than a predetermined threshold value, and relatively decreases the attenuation amount of the variable attenuator in a case where the reception level is equal to or less than the predetermined threshold value.
(10)
The signal processing apparatus according to (8) or (9), in which the amplifier further includes a resistor coupled to the output terminal of the operation amplifier and to the gate side of one of the P-type transistor and the N-type transistor.

In the amplifier and the signal processing apparatus according to one embodiment of the present disclosure, the transformer is provided in which the primary coil is coupled to the source side of one of the P-type transistor and the N-type transistor, and the variable attenuator is provided between the secondary coil and the gate terminals of both of the N-type transistor and the P-type transistor. Hence, it is possible to allow for the low voltage operation, and to control the low-noise amplifier to an appropriate gain and to achieve the high linearity in the low-noise amplifier even upon the excessive input. Note that the effects of the present disclosure are not necessarily limited to the effects described here, but may include any of the effects described herein.

The present application claims the benefit of Japanese Priority Patent Application JP2019-158605 filed with the Japan Patent Office on Aug. 30, 2019, the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. An amplifier, comprising:
a P-type transistor and an N-type transistor that are connected in series;
an operation amplifier having an output terminal, an inverting input terminal, and a non-inverting input terminal, the output terminal being coupled to a gate side of one of the P-type transistor and the N-type transistor, one of the inverting input terminal and the non-inverting input terminal being coupled to drain sides of both of the P-type transistor and the N-type transistor, a reference voltage being applied to the other of the inverting input terminal and the non-inverting input terminal;
a transformer having a primary coil and a secondary coil, the primary coil being coupled to a source side of one of the P-type transistor and the N-type transistor; and
a variable attenuator provided between the secondary coil and gate terminals of both of the N-type transistor and the P-type transistor.

2. The amplifier according to claim 1, further comprising a source degeneration resistor provided between the primary coil and a source of one of the P-type transistor and the N-type transistor.

3. The amplifier according to claim 2, further comprising a bypass capacitor coupled to the source side of one of the P-type transistor and the N-type transistor and connected in parallel with a path that includes the source degeneration resistor and the primary coil.

4. The amplifier according to claim 1, wherein the variable attenuator is configured to be set to pass-through or to be low in attenuation amount when an excessive input is absent.

5. The amplifier according to claim 2, wherein the source degeneration resistor is configured to be set to be low in resistance when an excessive input is absent.

6. The amplifier according to claim 3, further comprising:
the bypass capacitor; and
a switch that disconnects an electrical connection between the bypass capacitor and the source side of one of the P-type transistor and the N-type transistor when an excessive input is absent.

7. The amplifier according to claim 1, further comprising a resistor coupled to the output terminal of the operation amplifier and to the gate side of one of the P-type transistor and the N-type transistor.

8. A signal processing apparatus, comprising:
an amplifier; and
a controller that controls the amplifier,
the amplifier including:
- a P-type transistor and an N-type transistor that are connected in series,
- an operation amplifier having an output terminal, an inverting input terminal, and a non-inverting input terminal, the output terminal being coupled to a gate side of one of the P-type transistor and the N-type transistor, one of the inverting input terminal and the non-inverting input terminal being coupled to drain sides of both of the P-type transistor and the N-type transistor, a reference voltage being applied to the other of the inverting input terminal and the non-inverting input terminal,
- a transformer having a primary coil and a secondary coil, the primary coil being coupled to a source side of one of the P-type transistor and the N-type transistor, and
- a variable attenuator provided between the secondary coil and gate terminals of both of the N-type transistor and the P-type transistor, wherein
the controller controls the variable attenuator by a control signal corresponding to a reception level of a signal outputted from the amplifier, or a reception level of a signal generated on a basis of the signal outputted from the amplifier.

9. The signal processing apparatus according to claim 8, wherein the controller relatively increases an attenuation amount of the variable attenuator in a case where the reception level is greater than a predetermined threshold value, and relatively decreases the attenuation amount of the variable attenuator in a case where the reception level is equal to or less than the predetermined threshold value.

10. The signal processing apparatus according to claim 8, wherein the amplifier further includes a resistor coupled to the output terminal of the operation amplifier and to the gate side of one of the P-type transistor and the N-type transistor.

* * * * *